(12) United States Patent
Miyake et al.

(10) Patent No.: US 7,576,014 B2
(45) Date of Patent: Aug. 18, 2009

(54) SEMICONDUCTOR DEVICE AND MANUFACTURING METHOD THEREOF

(75) Inventors: Takashi Miyake, Tonami (JP); Hiroyuki Doi, Tonami (JP)

(73) Assignee: Panasonic Corporation, Osaka (JP)

(*) Notice: Subject to any disclaimer, the term of this patent is extended or adjusted under 35 U.S.C. 154(b) by 364 days.

(21) Appl. No.: 11/283,849

(22) Filed: Nov. 22, 2005

(65) Prior Publication Data

US 2006/0110935 A1    May 25, 2006

(30) Foreign Application Priority Data

Nov. 24, 2004    (JP)    ............................. 2004-339424

(51) Int. Cl.
*H01L 21/31*    (2006.01)
*H01L 21/469*    (2006.01)

(52) U.S. Cl. .................. 438/778; 438/132; 438/601; 257/E21.592

(58) Field of Classification Search ................ 438/778; 257/E21.592, E23.15, 529
See application file for complete search history.

(56) References Cited

U.S. PATENT DOCUMENTS

| | | | | |
|---|---|---|---|---|
| 4,413,272 A | * | 11/1983 | Mochizuki et al. | 257/529 |
| 5,329,152 A | * | 7/1994 | Janai et al. | 257/529 |
| 5,444,102 A | * | 8/1995 | Nimitz et al. | 521/131 |
| 5,729,041 A | * | 3/1998 | Yoo et al. | 257/529 |
| 6,004,834 A | * | 12/1999 | Tsukude et al. | 438/132 |
| 6,124,165 A | * | 9/2000 | Lien | 438/253 |
| 6,168,977 B1 | * | 1/2001 | Konishi | 438/132 |
| 6,448,113 B2 | * | 9/2002 | Lee et al. | 438/132 |
| 6,507,086 B1 | * | 1/2003 | Lee et al. | 257/529 |
| 6,617,664 B2 | * | 9/2003 | Hayashi et al. | 257/529 |
| 6,656,826 B2 | * | 12/2003 | Ishimaru | 438/612 |
| 6,677,226 B1 | * | 1/2004 | Bowen et al. | 438/601 |
| 6,827,868 B2 | * | 12/2004 | Daubenspeck et al. | 216/17 |
| 6,875,681 B1 | * | 4/2005 | Bohr | 438/612 |
| 6,911,386 B1 | * | 6/2005 | Lee et al. | 438/612 |
| 6,914,319 B2 | * | 7/2005 | Okada | 257/529 |
| 7,323,760 B2 | * | 1/2008 | Sakoh | 257/529 |
| 2005/0224908 A1 | * | 10/2005 | Barth | 257/528 |

(Continued)

FOREIGN PATENT DOCUMENTS

JP    2003-218110    7/2003

(Continued)

OTHER PUBLICATIONS

Japanese Notice of Reasons for Refusal, w/ English translation thereof, issued in Japanese Patent Application No. JP 2004-339424 dated Apr. 22, 2009.

*Primary Examiner*—Marcos D. Pizarro
*Assistant Examiner*—Igwe U. Anya
(74) *Attorney, Agent, or Firm*—McDermott Will & Emery LLP

(57) ABSTRACT

A semiconductor device with a fuse 3a to be cut for a circuit modification, of which passivation film coating the uppermost wiring layer is formed in a two-layer structure including a first insulating film 11 with high filling capability and a second insulating film 12 blocking penetration of moisture or impurities. An opening 21 formed in a specific depth through the insulating films on the fuse 3a is coated by a third insulating film 13 with the blocking capability. This prevents the penetration of moisture or impurities, and the corrosion of the fuse 3a.

11 Claims, 8 Drawing Sheets

U.S. PATENT DOCUMENTS

| | | | |
|---|---|---|---|
| 2003/0062592 A1* | 4/2003 | Sato et al. | 257/529 |
| 2004/0124546 A1* | 7/2004 | Saran et al. | 257/787 |
| 2004/0150070 A1* | 8/2004 | Okada et al. | 257/508 |
| 2004/0195648 A1* | 10/2004 | Fujiki et al. | 257/529 |
| 2004/0235220 A1* | 11/2004 | Maeda | 438/106 |
| 2005/0161766 A1* | 7/2005 | Sato et al. | 257/529 |

FOREIGN PATENT DOCUMENTS

| | | |
|---|---|---|
| JP | 2004-281918 | 10/2004 |
| WO | WO 99/34423 | 7/1999 |

* cited by examiner

SEMICONDUCTOR DEVICE AND MANUFACTURING METHOD THEREOF

RELATED APPLICATIONS

This present application claims the benefit of patent application number 2004-339424, filed in Japan on Nov. 24, 2004, the subject matter of which is hereby incorporated herein by reference.

FIELD OF THE INVENTION

The present invention generally relates to a semiconductor device provided with repair fuses and a manufacturing method thereof, and more specifically, to a semiconductor device for a Ball Grid Allay (BGA) package and a manufacturing method thereof.

BACKGROUND OF THE INVENTION

A conventional semiconductor device is provided with various types of circuit elements forming circuits and wirings interconnecting the circuit elements on a silicon substrate, for example. Those wirings usually are formed in a multi-level structure. On an uppermost wiring layer, electrodes for external connections (which is defined as a pad hereinafter), and repair fuses for replacing a defective circuit with a redundant circuit are formed.

FIG. 6 is a sectional view schematically showing the uppermost wiring layer of a conventional semiconductor device. In FIG. 6, a fuse 3a, a wiring 3b, and a pad 3c are formed on an interlayer insulator 1, as the uppermost wiring layer 3. Under the interlayer insulator 1, there is a semiconductor substrate, on which other wiring layers and circuit elements such as transistor are formed.

As shown in FIG. 6, on the uppermost wiring layer 3 formed by etching a metal such as an aluminum alloy, a passivation film 5 made of dense silicon nitride film is formed by Chemical Vapor Deposition process (CVD) in order to prevent a mechanical breakdown and penetration of moisture or impurities such as sodium ion that causes failure of the semiconductor device.

An opening 7 for exposing a part of a surface of the pad 3c is formed by etching on the passivation film 5. The passivation film 5 on the fuse 3a is also etched to form an opening 6 in need of carrying out the following cutting process, resulting that the thickness of the passivation film 5 becomes thinner than the other portions. For instance, while the passivation film 5 is approximately 1000 nm in thickness, the film thickness at the opening 6 is approximately 150 nm.

The fuse 3a, as well as the wiring 3b, consists of a metal like the aluminum alloy. The necessity of the fuse cutting is decided according to an analysis of electrical characteristics test through the pad 3c. If the fuse cutting is required, the fuse 3a is heated by irradiation of a laser or a charged beam (an ion beam, for example) through the thin passivation film 5, and then the fuse 3a is blown and cut by liquefying and evaporating. According to this process, the defective circuit is turned out to be replaced with the redundant circuit.

Even if the fuse 3a is in the state of being coated by the thick passivation film 5 as well as the other portions, the cutting process of the fuse 3a can be carried out. In such case, since the cutting process will cause damages to the other portions other than the fuse 3a, the amount of irradiation energy of the laser cannot be increased needlessly. That is, when the fuse cutting is carried out on the fuse 3a coated by the thick passivation film 5, the processing time increases depending on the thickness of the passivation film 5. Therefore, by letting passivation film 5 thinner on the fuse 3a as mentioned above, the cutting process of the fuse 3a can be easily carried out and the penetration of moisture or impurities into non-cutting fuses 3a is prevented.

In case of the semiconductor device for the BGA Package (Flip Chip Bonding), a bump is formed on the passivation film 5 illustrated in FIG. 6 in a following way. As shown in FIG. 7, a surface insulating film 31 made of BCB (benzocycrobuten), which is for the planarization and the surface protection, is formed on the passivation film 5. An opening for exposing a part of the surface of the pad 3c is formed through the surface insulating film 31.

On a surface and a periphery of the opening, a barrier metal layer 32 made of such as nickel is formed in order to improve the adhesion between a bump material (solder) filling the opening by subsequent steps and the surface insulating film 31, and also to prevent the bump material from diffusing to the surface insulating film 31.

Next, on an upper surface of the insulating film 31, a metal mask having an opening in bump formation position that corresponds to the barrier metal layer 32, is placed, and a solder paste is patterned through the metal mask. After the patterned solder paste is reflowed, a spherical solder bump 33 is formed by the action of the surface tension.

In the semiconductor device for the BGA package, as the number of pins are increased and each pin pitch is reduced, the respective gaps between wirings 3b, forming the uppermost wiring layer 3, become narrow, as shown in FIG. 7. Accordingly, at such region of wirings 3b being in close, the passivation film 5 has excessive uneven structure due to the uneven structure of wirings 3b. Additionally, in the process of forming the passivation film 5 in such region, the film material on the wirings 3b has been connected before the gaps between the wirings 3b are completely filled, whereby a void 41 being not filled with the passivation film 5 is formed between the wirings 3b.

Moreover, in the semiconductor device for the BGA package, the thick surface insulating film 31 is formed on the passivation film 5, as shown in FIG. 7. This structure makes it easy to generate a large stress by the heating in forming the solder bump 33. Consequently, when the stresses are concentrated on the uneven structure of the passivation film 5 and the voids 41 are existed therein, cracks 42 will appear in the passivation film 5 and the interlayer insulator 1.

As a solution, in the semiconductor device for the BGA package, a structure as shown in FIG. 8A is adopted in order to avoid the voids 41 being formed. In the structure that is disclosed in Kohyo (National Publication of Translated Version) No. 2002-500440, the passivation film 5 is formed in a two-layer structure including a first insulating film 11 and a second insulating film 12. The first insulating film 11 has a high filling capability for the gaps between the wirings 3b, and is superior in planarization of a surface of a generated film, like a silicon dioxide film deposited by CVD process using source gas including Silane (e.g. $SiH_4$ and $O_2$ mixture), for example. The second insulting film 12 consists of silicon nitride film placed on the first insulting film 11 that prevents moisture or impurities penetrating into the first insulating film 11.

Since the passivation film is formed in such two-layer structure wherein the first insulating film 11 with the high filling capability is placed under the second insulating film 12, the generation of voids 41 can be prevented, and the uneven structure of the passivation film also can be improved significantly. In result, it is possible to mitigate the stress concentration and avoid the occurrence of cracks 42.

SUMMARY OF THE INVENTION

Even when the passivation film with the above two-layer structure is employed, the opening is formed on the fuse 3a after the deposition of the second insulating film 12 is completed. As shown in FIG. 8B (an enlarged view of a portion A in FIG. 8A before the deposition of the surface insulating film 31), the structure on the fuse 3a is that the first insulating film 11 is exposed by etching the second insulating film 12, or the top surface of the fuse 3a is exposed by etching the first insulating film 11 together with the second insulating film 12.

The semiconductor manufacturing process is categorized to two processes, a front-end process and a back-end process. The front-end process is for forming the semiconductor device on the semiconductor wafer, which corresponds to the steps up to the cutting process of the fuse 3a in the above example. The back-end process is for sealing the semiconductor device in the BGA package, which corresponds to the steps after forming the surface insulating film 31 in the above example. Generally, the back-end process is carried out at a different place from the front-end process. Therefore, after the fuse 3a is cut in the front-end process, the semiconductor device is kept in the state that the first insulating film 11 (or the fuse 3a) is exposed, before the device is sent to the next back-end process.

Despite of the superior filling capability, the first insulating film 11 has no resistibility to the penetration of moisture or impurities. If moisture or impurities reach the fuse 3a before the back-end process and the problems of corrosion and so forth are caused, that become a factor of reducing the long-term reliability of the semiconductor device.

The present invention is suggested in view of the above conventional conditions, and has an object to provide a semiconductor device capable of avoiding the occurrence of cracks caused from the stress concentration, and preventing the penetration of moisture or impurities to the fuse, and has an object of providing the manufacturing method thereof.

In order to achieve the object described above, the invention employs following means. First of all, the invention premises a method of manufacturing a semiconductor device provided with a fuse to be cut to modify a circuit configuration if necessary. In the method, an uppermost wiring layer of the semiconductor device described above is coated, a first insulting film which completely fills a gap between members included in the wiring layer is formed, and a second insulating film, which have higher blocking capability against penetration of moisture or impurities than the first insulating film, is formed by coating the first insulating film. Then, after etching the insulating films deposited on the fuse provided to any wiring layer of the semiconductor device, a third insulating film is formed so as to have the blocking capability of the same level or the higher level than that of the second insulating film, and coat at least the etched portion.

In the etching process described above, the insulating films on the fuse may be completely etched, or may be etched so as to leave the insulating film at a thickness not disturbing the cutting of the fuse.

In the present invention, since the fuse not required to cut is coated by the third insulating film with the blocking capability, it is possible to prevent the penetration of moisture or impurities so as to reduce the defective fuse.

Additionally, it is possible to use a Non Doped Silicon Glass (NSG) film deposited by high density plasma Chemical Vapor Deposition process as the first insulating film. Under a depositing condition with high filling capability, the first insulating film may be a silicon nitride film deposited by CVD.

It is possible to employ silicon nitride film deposited by CVD with a high resistibility (blocking capability) to the penetration of moisture or impurities for the second and third insulating films.

Moreover, the invention can provide a semiconductor device having a structure manufactured by the above method. That is, the semiconductor device in the invention, which is provided with a fuse to be cut to modify a circuit configuration if necessary, comprises a first insulating film coating an uppermost wiring layer of the semiconductor device, and completely filling a gap between members included in the wiring layer, and a second insulating film having higher blocking capability against penetration of moisture or impurities than the first insulating film, and coating the first insulating film. Further, it comprises an opening formed on the fuse provided to any wiring layer of the semiconductor device, and having a specific depth from the top surface of the second insulating film, and a third insulating film having blocking capability of the same level or higher level than that of the second insulating film, and coating at least the opening.

According to the present invention, the penetration of moisture or impurities to the fuse can be prevented, so that the defective fuse can be reduced. Therefore, it is possible to improve the long-term reliability of the semiconductor device remarkably.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF ILLUSTRATIVE EMBODIMENTS

Figure 1:
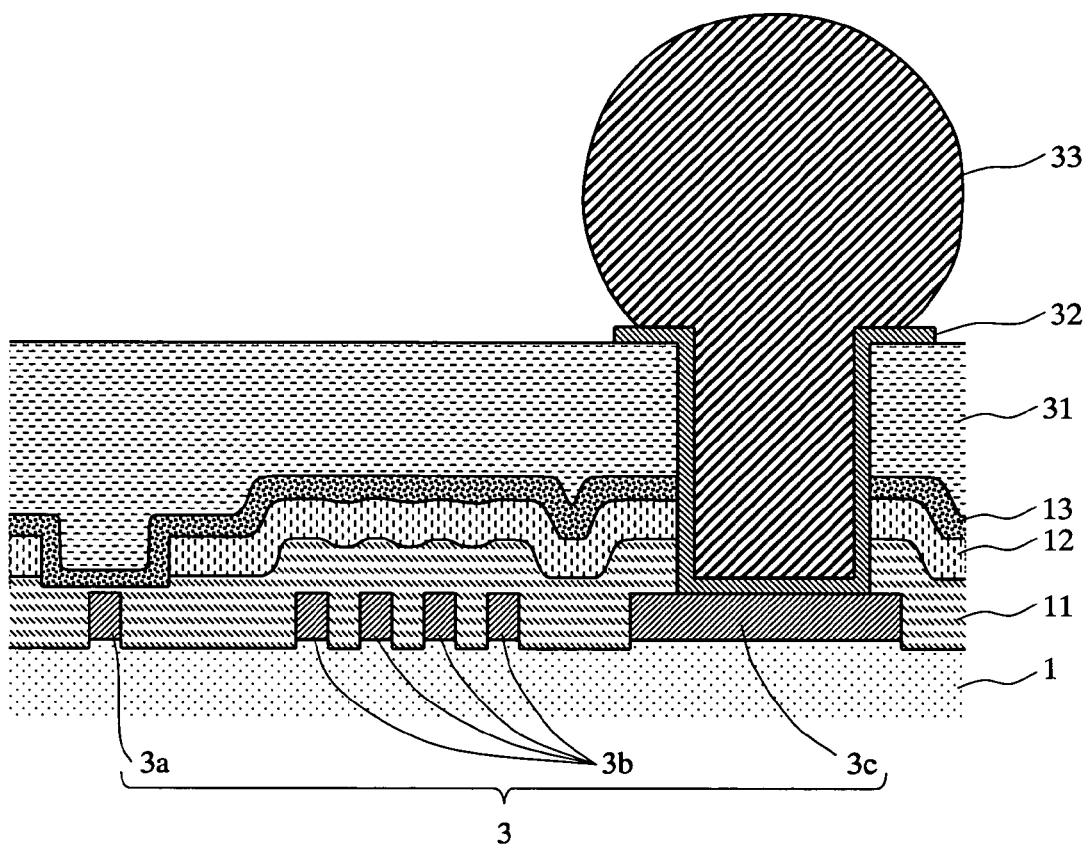
FIG. 1 is a sectional view of a relevant part of a semiconductor device of the present invention.

Embodiments of the invention are discussed here in accordance with attached drawings. FIG. 1 is a sectional view showing a relevant part of a semiconductor device in a first embodiment of the invention. FIGS. 2A to 2C, FIGS. 3A to 3C and FIGS. 4A to 4B are sectional views showing the processes for manufacturing an uppermost wiring layer of the semiconductor device in FIG. 1.

A structure of the semiconductor device in this embodiment is illustrated hereinafter together with the manufacturing processes thereof.

Figure 2A:
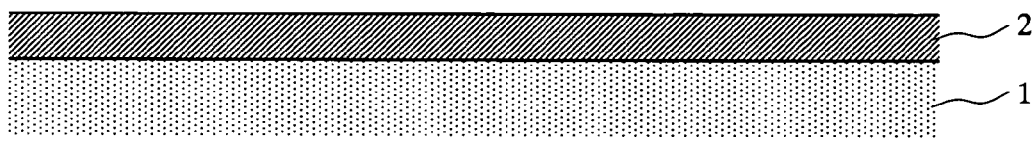
FIGS. 2A to 2C show sectional views of manufacturing processes of a semiconductor device of the present invention.
Figure 2B:
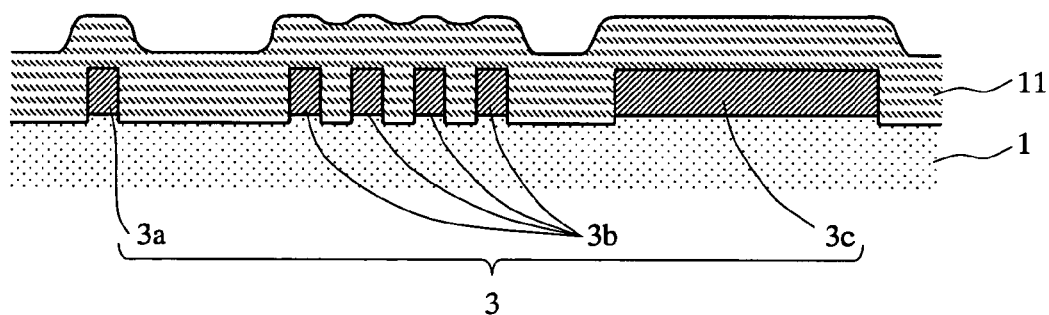

As shown in FIG. 1, FIG. 2A and FIG. 2B, the upper most wiring layer in the semiconductor device is formed on an interlayer insulator 1 (a base insulator 1) made of silicon dioxide film, so that the uppermost wiring layer may not be electrically connected to wirings and circuit elements in a lower wiring layer. Under the base insulator 1, a semiconductor substrate is formed by a conventional fabricating method, with which other wirings and circuits elements like a transistor are formed. Since the conventional fabricating method of the semiconductor substrate does not relate to the present invention directly, the description is omitted here.

The uppermost wiring layer may be formed by a conventional microfabrication technique, using a conventional wiring material for the semiconductor device. The invention does not define the material and the fabrication method in particular. For instance, the uppermost wiring layer may be formed as following processes.

As shown in FIG. 2A, a metal film 2 made of aluminum alloy is deposited over the base insulator 1. Next, a resist pattern (not shown in the drawing) is formed on the parts of metal film 2 on which metal patterns of such as a fuse 3a, a wiring 3b and a pad 3c are formed by the photolithography. The metal film 2 is etched using the resist pattern as an etching mask, whereby a wiring layer 3 such as a fuse 3a, a wiring 3b and a pad 3c, are formed. The thickness of the metal film 2 is defined as 850 nm. The metal film 2 is not always required to be a single-layer structure, and the structure may be a multi-layer structure depositing plural types of metals or metal alloys.

Subsequently, a first insulating film 11 is formed on the fuse 3a, the wiring 3b and the pad 3c. The first insulating film 11 is formed thick enough to completely fill at least the gap between the wirings 3b so as not to allow any space.

If it is possible to achieve a gap filling capability enough to fill the gap between the wirings 3b without spaces, the method and material for forming the first insulating film 11 is not limited in particular. In this embodiment, as the first insulating film 11, HDP-NSG film (High Density Plasma-Non Doped Silicon Glass, using $SiH_4$ and $O_2$ as source gas) formed by high-density plasma CVD, such as Microwave Excited High Density plasma CVD, ECR (Electron Cyclotron Resonance) CVD, and ICP (Inductively Coupled Plasma) CVD are used. This HDP-NSG film has a superior gap filling capability that can fill gaps with high aspect ratio, and allows a subsequent layer to be deposited smoothly. The thickness of the first insulating film 11, in the embodiment, is defined as 1100 nm which is thick enough to fill gaps between the wirings 3b without any space.

As the first insulating film 11, a silicon nitride film by Plasma CVD using $SiH_4$ and $NH_3$ as source gas, or a silicon dioxide film by Plasma CVD or Thermal CVD as TEOS (Tetraethoxysilane)/$O_2$ system or TEOS/$O_3$ system can be also used. In case of using the silicon nitride film to the first insulating film 11, in order to enhance the gap filling capability of the silicon nitride film, it is necessary to properly adjust a deposition pressure and a plasma excitation power (RF power) that is different from the general conditions of deposition as the passivation film.

Figure 2C:
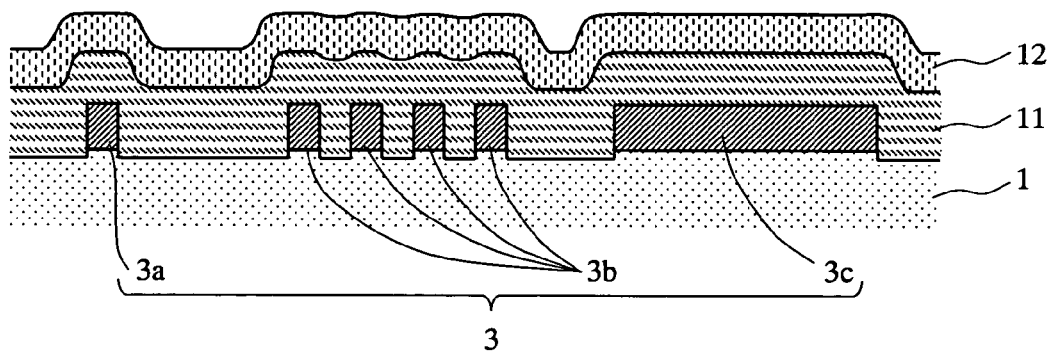

Next, as shown in FIG. 2C, a second insulating film 12 which is denser than the first insulating film 11 is formed on the first insulating film 11. The second insulating film 12 has a high resistibility to the penetration of moisture or impurities. In the embodiment, the silicon nitride film deposited by Plasma CVD, which is widely used as the passivation film so far, is used as the second insulating film 12. The second insulating film 12 may be desirably deposited in thickness enough to prevent the penetration of moisture or impurities, which is defined as approximately 600 nm.

Figure 3A:
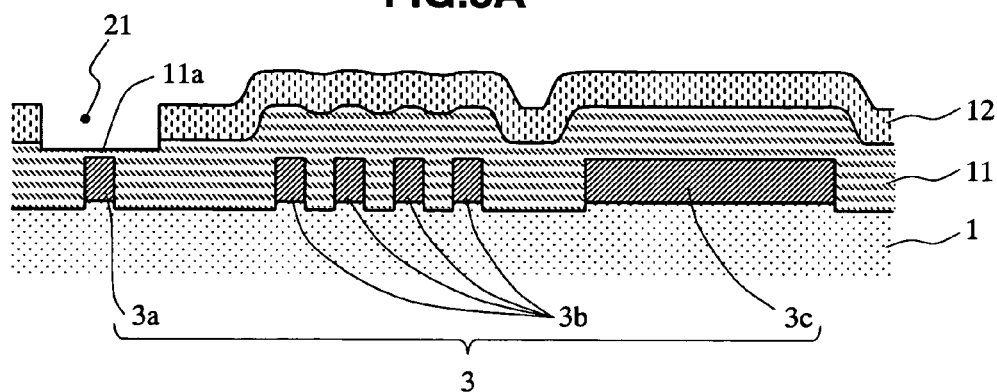
FIGS. 3A to 3C show sectional views of manufacturing processes of a semiconductor device of the present invention.

As shown in FIG. 3A, after the completion of deposition of the second insulating film 12, an opening 21 is formed in the insulting layers above the fuse 3a (the first insulating film 11 and the second insulating film 12) by removing the insulating films up to the specific depth from a top surface of the second insulating film 12.

A conventional etching technique may be used for forming the opening 21. In the embodiment, resist is coated on the second insulating film 12, before a resist pattern with openings at a projected place of the opening 21 is formed by the photolithography. By using the resist pattern as a mask, the second insulating film 12 and the first insulating film 11 are dry-etched sequentially by using etching gases suitable for respective insulating films (for example, $CF_4$ or Halogen). In order to avoid the damages of the fuse 3a caused by the exposure of the fuse 3a during the etching, without removing the insulating films on the fuse 3a thoroughly, a part of the first insulating film 11 is left as a coating film 11a. In the embodiment, the thickness of the coating film 11a is 150 nm.

The thickness of the coating film 11a is decided by controlling the amount of etching in the above etching process. To make it easy to control the film thickness of the coating film 11a, an etch-stop film may be formed. That is, the first insulating film 11 is deposited in thickness up to the thickness of being left as the coating film 11a, and the deposition of the first insulating film 11 is stopped temporarily. Then the etch-stop film is formed on the position at least facing to the fuse 3a (above the fuse 3a) on the first insulting film 11, using a material which can secure the etching selectivity against the first insulating film 11. Next, the deposition of the insulating film 11 is restarted. When the thickness reaches to the above-mentioned thickness (1100 nm), the deposition of the first insulating film 11 is completed. For instance, in case of using HDP-NSG film as the first insulating film 11, the silicon nitride film can be used as the etch-stop film.

Accordingly, in the process of etching in forming the opening 21, the amount of etching of the first insulating film 11 can be limited by the etch-stop film. Therefore, an over-etching can be performed, and the film thickness of the coating film 11a can be controlled in a simple manner. Moreover, since the thickness of the coating film 11a on the fuse 3a across a semiconductor wafer on which the semiconductor device is formed is extremely uniform, the laser irradiation condition for the cutting of the fuse 3a can be fixed, and the fuse cutting can be performed effectively.

Figure 3B:
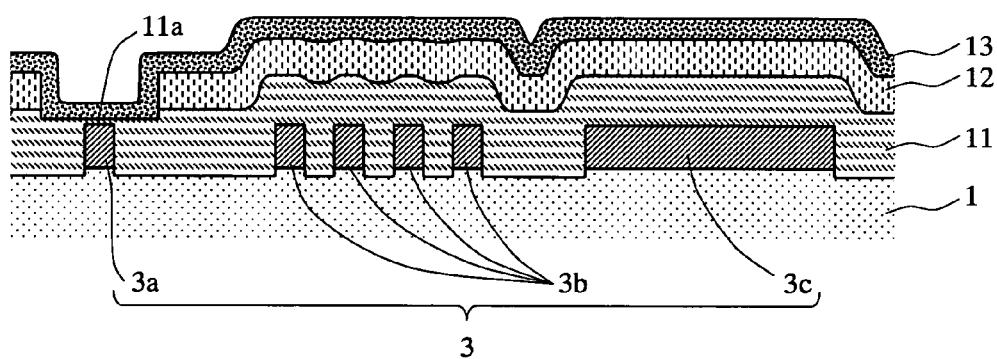

After the opening 21 is formed on the fuse 3a as mentioned above, a third insulating film 13 having a resistibility to the penetration of the moisture or impurities is formed thin in the same way as the second insulating film 12 as shown in FIG. 3B. In the embodiment, the silicon nitride film, which is deposited by Plasma CVD, is used to the third insulating film 13 as well as the second insulating film 12, and the film thickness is defined as approximately 200 nm. Besides, the third insulating film 13 is desired to be deposited as thick as possible so as not to prevent the cutting of the fuse 3a, and therefore the thickness of all the films on the fuse 3a is desired to be 500 nm or less.

Figure 3C:
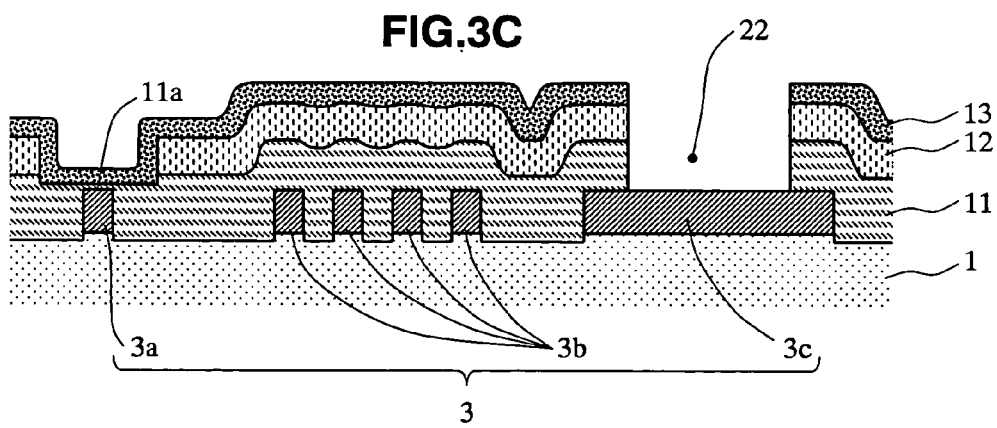

The third insulating film 13 may be deposited at least over a surface of the opening 21 above the fuse 3a. In an example shown in FIGS. 3A to 3C, however, the third insulating film 13 is formed over a whole surface in order to simplify the manufacturing process. After the third insulating film 13 is formed, the opening 22 for the external connection is formed on the pad 3c as shown in FIG. 3C.

When the opening 22 is thus formed on the pad 3c, the semiconductor device is completed. That is to say, the electric characteristics of the semiconductor device is measured through the pad 3c, and in accordance with the measurement result, it is decided whether or not to cut the fuse 3a.

When the cutting of the fuse 3a is decided as required, the fuse 3a is irradiated by laser (or charging beam, and so on), and then is cut together with the insulating films thereon (the coating film 11a and the third insulating film 13). When the cutting of the fuse 3a is decided as not required, the cutting process is not performed on the fuse 3a.

As described above, in the invention of the embodiment, the third insulating film 13 made of the silicon nitride film with the blocking capability against moisture or impurities is formed on the fuse 3a without being subjected to the cutting process, so that the fuse 3a can be protected from the penetration of moisture or impurities. Therefore, there is no possibility of corrosion of the uncut fuse 3a. That is, it is possible to improve the long-term reliability of the semiconductor device.

The third insulating film 13 on the fuse 3a that is subjected to the cutting process is removed together with the fuse 3a, and, in such part, the penetration of moisture or impurities is allowed. However, the fuse 3a is originally configured that, if the circuit is decided as defective by the electric characteristics measurement, the fuse 3a is cut to be replaced the defective circuit with the redundant circuit. Furthermore, in the semiconductor device, the cut fuse 3a is electrically separated from the peripheral circuits close to the fuse 3a. Even if moisture or impurities reach the fuse 3a, and the fuse 3a is corroded thereby, there is little possibility that the long-term reliability of the semiconductor device is reduced.

Figure 4A:
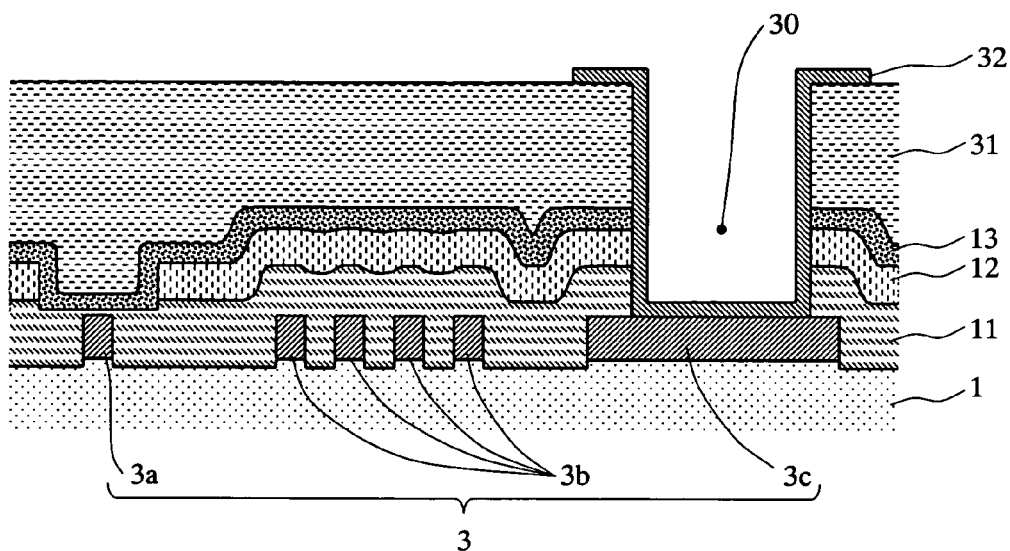
FIGS. 4A and 4B show sectional views of manufacturing processes of a semiconductor device of the present invention.
Figure 4B:
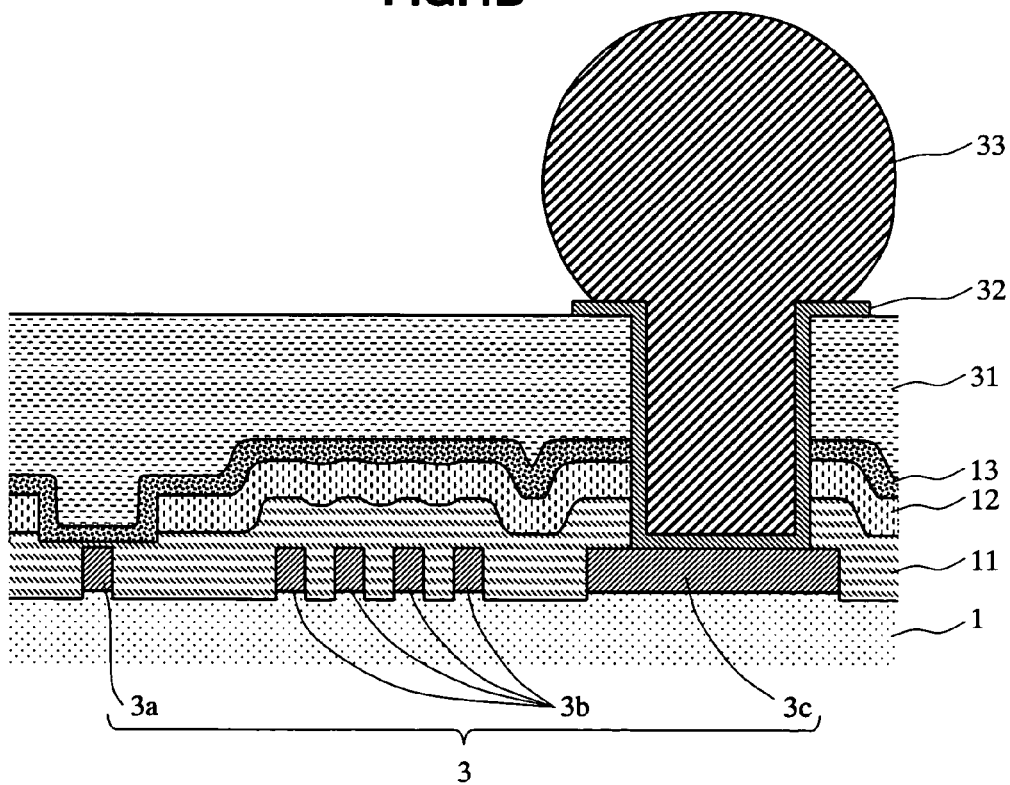

The process of forming the solder bump 33 after the cutting process is the same as the aforementioned conventional process. Specifically, as shown in FIG. 4A, a surface insulating film 31 made of BCB is formed on the third insulating film 13. On the surface insulating film 31, an opening 30 is formed for exposing a part of the surface of the pad 3c. On the surface and periphery of the opening 30, a barrier metal layer 32 is formed. By reflowing a solder paste that is patterned through the metal mask on the barrier metal layer 32, a spherical solder bump 33 can be formed as shown in FIG. 4B.

In the present invention, since the first insulating film 11 with the high filling capability is formed just above the wirings 3b formed in narrow pitches, it is possible to prevent a generation of voids 41 in a gap between the wirings 3b. The uneven structure caused by the wirings 3b can be minimized, too. Therefore, if the stress is generated at forming the solder bump 33, there is no possibility that a crack is generated.

As discussed above, the invention can prevent that moisture or impurities reach the fuse 3a, and also can restrict the defective factor such as the corrosion, so that it is possible to improve the long-term reliability of the semiconductor device.

Figure 5A:
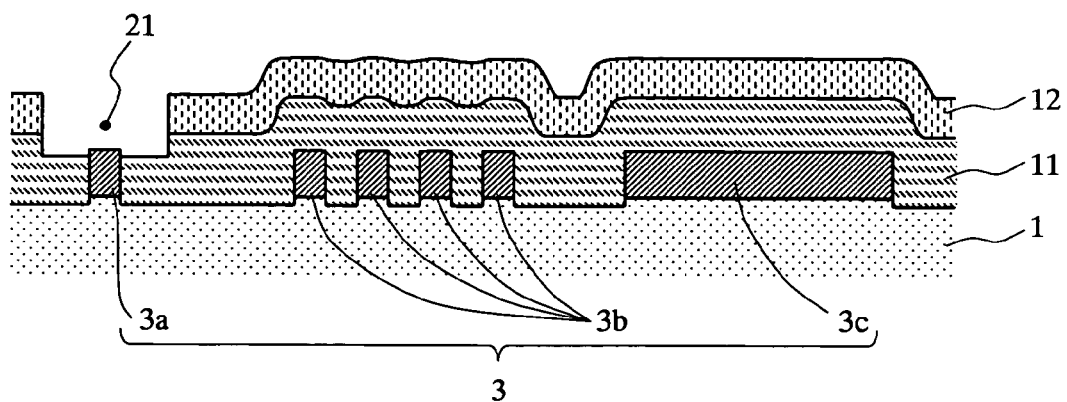
FIGS. 5A to 5C show sectional views of modified manufacturing processes of a semiconductor device of the present invention.
Figure 5B:
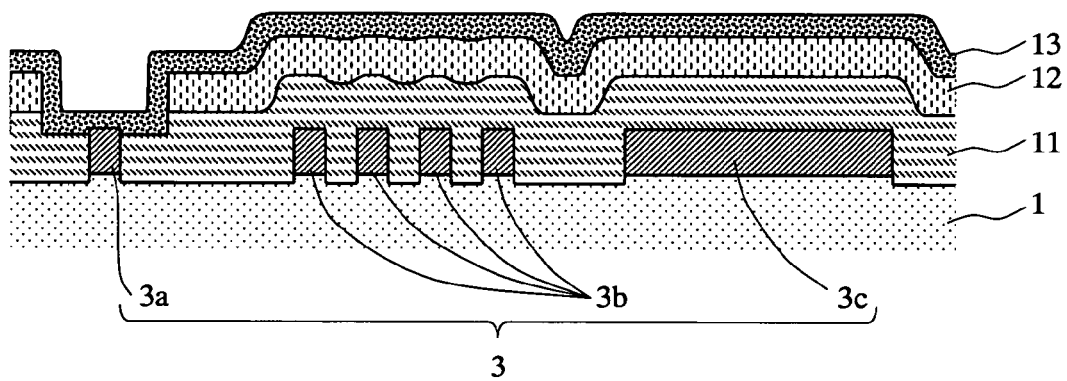
Figure 5C:
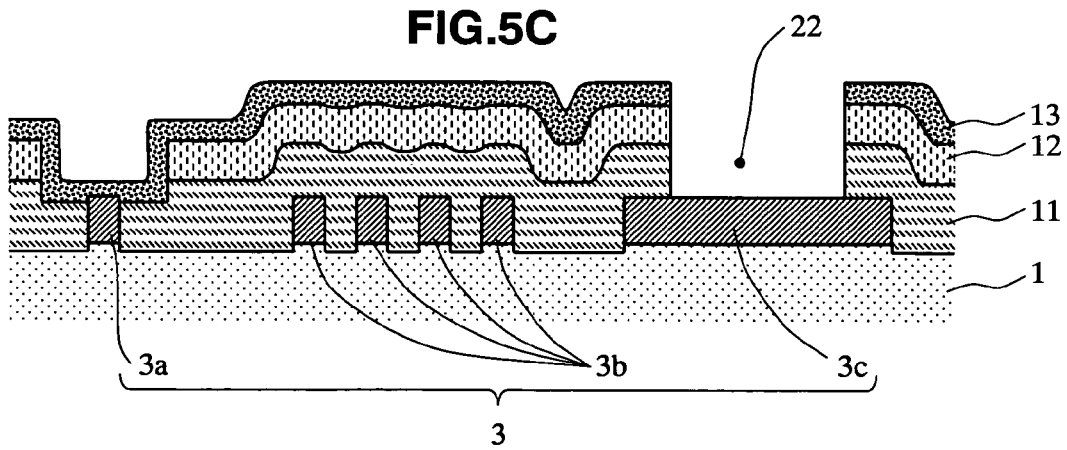
Figure 6:
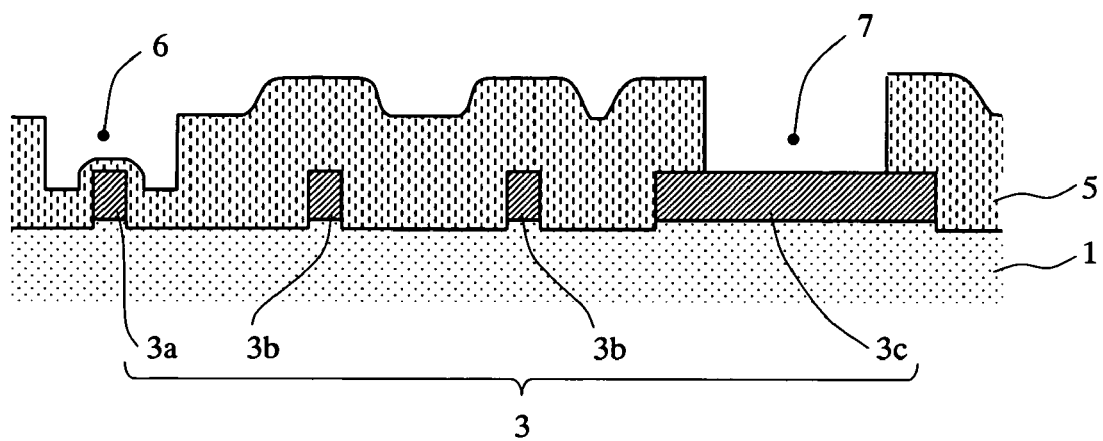
FIG. 6 is a sectional view of a relevant part of a semiconductor device with a conventional passivation film in a single-level structure.
Figure 7:
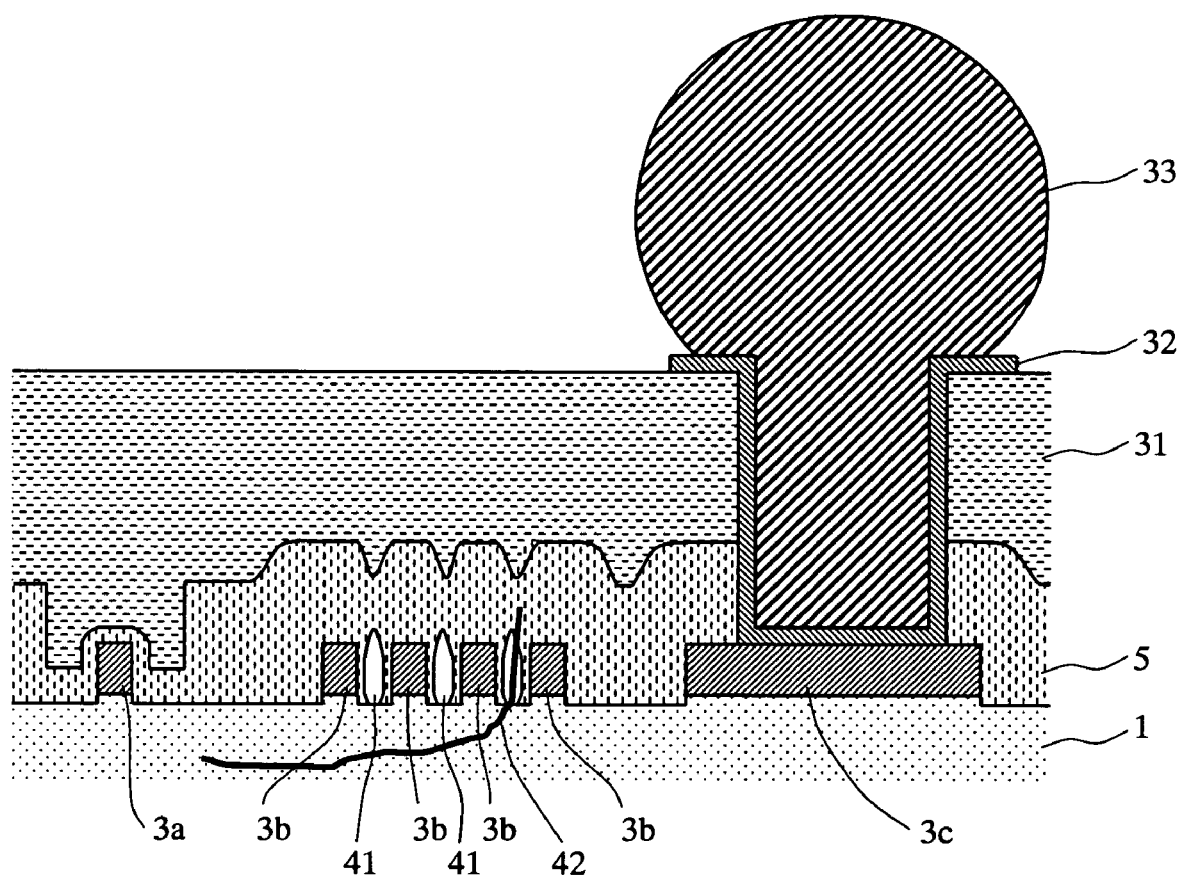
FIG. 7 is a sectional view of a relevant part of a semiconductor device with a conventional passivation film in a single-level structure.
Figure 8A:
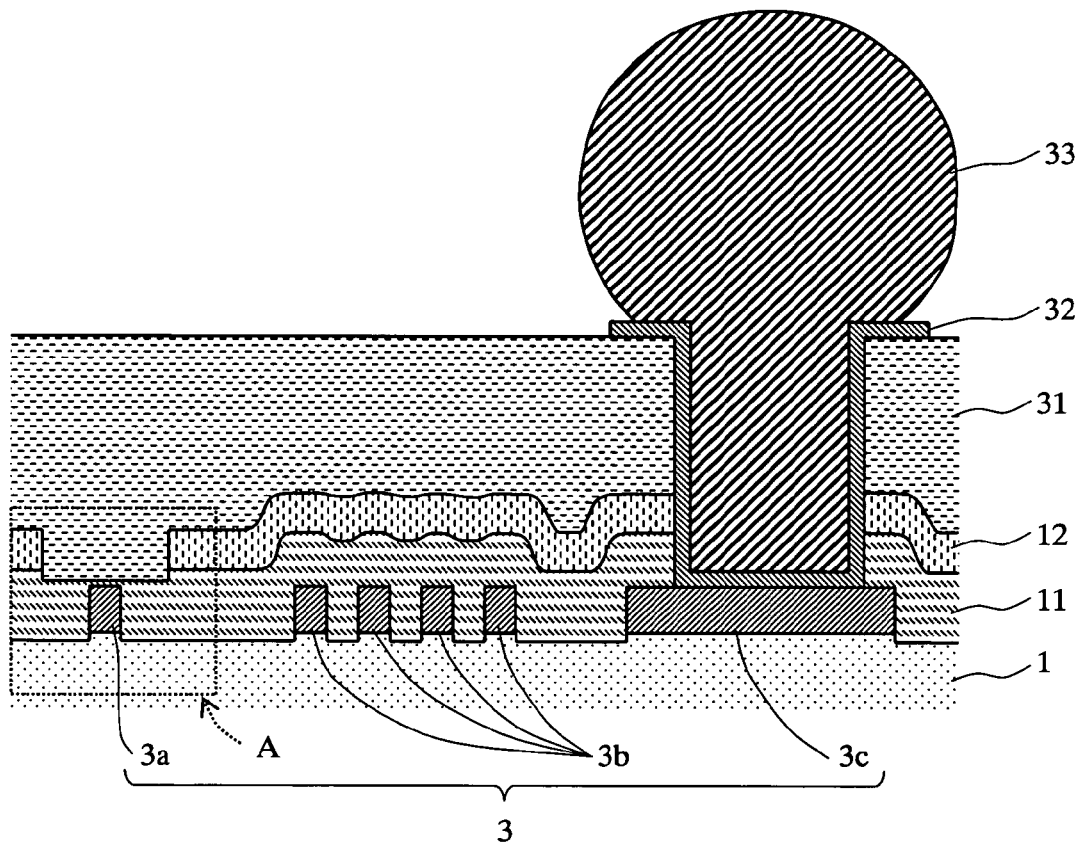
FIGS. 8A to 8B show sectional view of a relevant part of a semiconductor device with a conventional passivation film in a two-level structure.
Figure 8B:
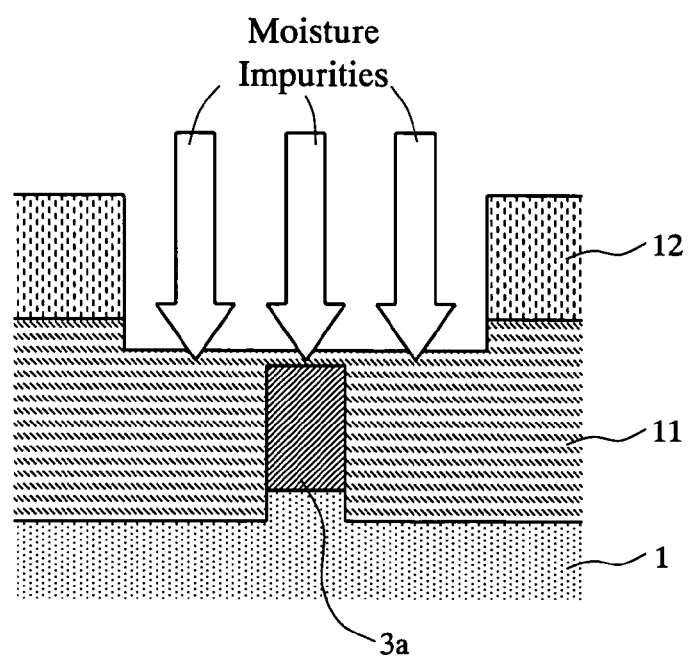

The above discussion is concerned with a configuration that the first insulating film 11 is left thin on the surface on the fuse 3a. Further, there is another embodiment as shown in FIGS. 5A to 5C. That is, without leaving the coating layer 11a on the fuse 3a in forming the opening 21, all the insulating films can be etched.

The following discusses about the modified embodiment.

After the second insulating film 12 is formed in the same way as above (FIG. 2C), a resist pattern is formed on the second insulating film 12 to be an etching mask. Then, the second insulating film 12 and the first insulating film 11 are etched in sequence by the dry-etching, whereby the top surface of the fuse 3a is exposed (FIG. 5A). The subsequent processes are the same as the foregoing embodiment, and the explanation is not described here.

This makes it possible to perform the over-etching of the first insulating film 11, so that a process margin can be expanded as compared with the example shown in FIG. 3A. In this case, it is desirable to etch the first insulating film 11 by using an etching gas with higher etching selectivity against the material of the fuse 3a. In order to avoid the etching damages to the fuse 3a, the fuse 3a may be formed by employing the multi-layer structure wherein a protecting layer with a high etching resistibility is disposed on the metal film 2.

The above mentioned embodiments are based on a configuration wherein the fuse is formed on the uppermost wiring layer. However, it is nevertheless to say that the invention can be used to a case where the fuse is formed in any wiring layer of the semiconductor device.

The embodiments illustrated herein are for illustrative purpose only. They should not be construed to limit the scope of the claims. For instance, the materials and processes mentioned herein can be replaced with various equivalent materials and processes.

The present invention can provide an effect that it is possible to improve the long-term reliability of the semiconductor device, and the invention is useful for the semiconductor device with repair fuses.

What is claimed is:

1. A method of manufacturing a semiconductor device including a plurality of wiring layers and a fuse, the fuse being formed in a layer of the wiring layers, to be cut to modify a circuit configuration, the manufacturing method comprising the steps of:
   forming a first insulating film so as to coat an uppermost wiring layer of the wiring layers and the fuse;
   forming a second insulating film on the first insulating film;
   forming an opening for the fuse by etching the first and second insulating films; and
   forming a third insulating film so as to coat at least the opening;
   wherein the second insulating film has blocking capability against penetration of moisture or impurities higher than that of the first insulating film, and an intrinsic film property of the third insulating film has blocking capability against penetration of moisture or impurities higher than that of the second insulating film.

2. A method of manufacturing a semiconductor device according to claim 1, wherein the etching is for removing all insulating films including the first and second insulating films formed on the fuse, or for removing the insulating films formed on the fuse so as to leave the insulating film at a thickness not disturbing the fuse cutting.

3. A method of manufacturing a semiconductor device according to claim 2, wherein the second insulating film and the third insulating film are silicon nitride films deposited by Chemical Vapor Deposition process.

4. A method of manufacturing a semiconductor device according to claim 1, further comprising the steps of:
   depositing a metal film for forming the uppermost wiring layer; and
   forming the uppermost wiring layer by disposing the fuse and a plurality of wirings consisting of the metal film to be adjacent to each other with a narrow gap;
   wherein, in the first insulating film forming step, the first insulating film fills the narrow gap without voids.

5. A method of manufacturing a semiconductor device according to claim 4, wherein the first insulating film is a Non Doped Silicon Glass film deposited by High-Density Plasma Chemical Vapor Deposition process.

6. A method of manufacturing a semiconductor device according to claim 4, wherein the first insulating film is a silicon nitride film deposited by Chemical Vapor Deposition process.

7. A method of manufacturing a semiconductor device according to claim 1, wherein the second insulating film and the third insulating film are silicon nitride films deposited by Chemical Vapor Deposition process.

8. A semiconductor device including a plurality of wiring layers and a fuse, the fuse being formed in a layer of the wiring layers, to be cut to modify a circuit configuration, the semiconductor device comprising:

a first insulating film coating an uppermost wiring layer of the wiring layers and the fuse;

a second insulating film formed on the first insulating film, and coating the first insulating film;

an opening for the fuse being generated at the first and second insulating films, and having a specific depth from a top surface of the second insulating film; and a third insulating film formed so as to coat at least the opening;

wherein the second insulating film has blocking capability against penetration of moisture or impurities higher than that of the first insulating film, and an intrinsic film property of the third insulating film has blocking capability against penetration of moisture or impurities higher than that of the second insulating film.

9. A semiconductor device according to claim 8, wherein the specific depth of the opening is from the top surface of the second insulating film to the top surface of a insulating film being left just above the fuse, the insulating film being left just above the fuse at a thickness not to disturb the fuse cutting.

10. A semiconductor device according to claim 8, wherein the specific depth of the opening is from the top surface of the second insulating film to a top surface of the fuse.

11. A semiconductor device according to claim 8, wherein the uppermost wiring layer has the fuse and a plurality of wirings disposed adjacent to each other with a narrow gap, the first insulating film fills the narrow gap without voids, the fuse and the plurality of wirings consists of a same metal film.

* * * * *